US010048664B2

United States Patent
Hasimoto et al.

(10) Patent No.: US 10,048,664 B2
(45) Date of Patent: Aug. 14, 2018

(54) COATING METHOD, COMPUTER STORAGE MEDIUM AND COATING APPARATUS

(71) Applicant: Tokyo Electron Limited, Tokyo (JP)

(72) Inventors: Takafumi Hasimoto, Koshi (JP); Shinichi Hatakeyama, Koshi (JP); Naoki Shibata, Koshi (JP); Kousuke Yoshihara, Koshi (JP); Minoru Kubota, Koshi (JP); Hiroyuki Ide, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 236 days.

(21) Appl. No.: 14/963,802

(22) Filed: Dec. 9, 2015

(65) Prior Publication Data
US 2016/0167079 A1 Jun. 16, 2016

(30) Foreign Application Priority Data

Dec. 11, 2014 (JP) .................................. 2014-250571

(51) Int. Cl.
*B05C 5/00* (2006.01)
*G05B 15/02* (2006.01)
(Continued)

(52) U.S. Cl.
CPC ............. *G05B 15/02* (2013.01); *B05D 1/005* (2013.01); *G03F 7/162* (2013.01);
(Continued)

(58) Field of Classification Search
CPC ...... G05B 15/02; H01L 21/6715; G03F 7/162; B05D 1/005; B05D 3/0466; B05D 3/042; B05D 3/104
See application file for complete search history.

(56) References Cited

U.S. PATENT DOCUMENTS 6,332,723 B1 * 12/2001 Matsuyama .......... G03F 7/3021
134/105
9,070,731 B2 * 6/2015 Tachibana ............... G03F 7/162
(Continued)

FOREIGN PATENT DOCUMENTS

JP  06-210230 A1  8/1994
JP  2003-136010 A1  5/2003
(Continued)

*Primary Examiner* — Ramesh Patel
(74) *Attorney, Agent, or Firm* — Burr & Brown, PLLC

(57) ABSTRACT

There is provided a coating method which can apply a coating solution uniformly onto a substrate surface while reducing the amount of the coating solution supplied. The coating method for applying a coating solution onto a wafer includes the steps of: supplying a solvent for the coating solution onto the wafer to form an annular liquid film of the solvent in a peripheral area of the wafer; supplying the coating solution to the center of the wafer while rotating the wafer at a first rotational speed (time $t_1$-$t_2$); and allowing the coating solution to spread on the wafer by rotating the wafer at a second rotational speed which is higher than the first rotational speed (time $t_4$-$t_5$). The supply of the solvent is continued until just before the coating solution comes into contact with the liquid film of the solvent (time $t_0$-$t_3$).

11 Claims, 13 Drawing Sheets

(51) Int. Cl.
*H01L 21/02* (2006.01)
*B05C 13/02* (2006.01)
*B05B 1/00* (2006.01)
*B05D 1/00* (2006.01)
*G03F 7/16* (2006.01)
*H01L 21/67* (2006.01)
*B05D 3/04* (2006.01)
*B05D 3/10* (2006.01)

(52) U.S. Cl.
CPC .......... *H01L 21/6715* (2013.01); *B05D 3/042* (2013.01); *B05D 3/0466* (2013.01); *B05D 3/104* (2013.01)

(56) References Cited

U.S. PATENT DOCUMENTS

| | | | |
|---|---|---|---|
| 9,278,373 | B2* | 3/2016 | Nakazawa .......... H01L 21/6715 |
| 2004/0084144 | A1* | 5/2004 | Yokouchi ................ C03C 15/00 156/345.11 |
| 2007/0197050 | A1* | 8/2007 | Shirley ................ H01L 21/6715 438/800 |
| 2008/0057194 | A1 | 3/2008 | Tanaka |
| 2008/0057834 | A1* | 3/2008 | Kroeninger ............. B24B 37/30 451/44 |
| 2008/0092929 | A1* | 4/2008 | Yokouchi .......... H01L 21/67034 134/30 |
| 2012/0135358 | A1 | 5/2012 | Tanaka |
| 2014/0072709 | A1 | 3/2014 | Nakazawa |
| 2014/0299161 | A1* | 10/2014 | Tanaka ................. G03F 7/3021 134/30 |

FOREIGN PATENT DOCUMENTS

| | | |
|---|---|---|
| JP | 2008-060462 A1 | 3/2008 |
| JP | 2014-050803 A1 | 3/2014 |
| JP | 2014-151249 A1 | 8/2014 |

* cited by examiner

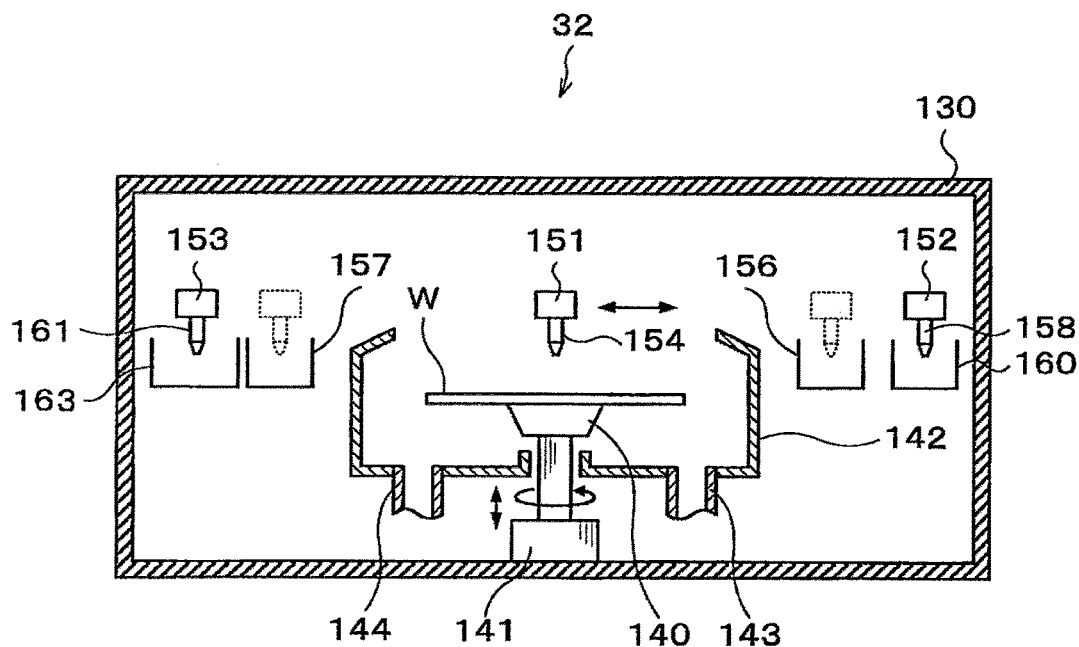
F I G. 4
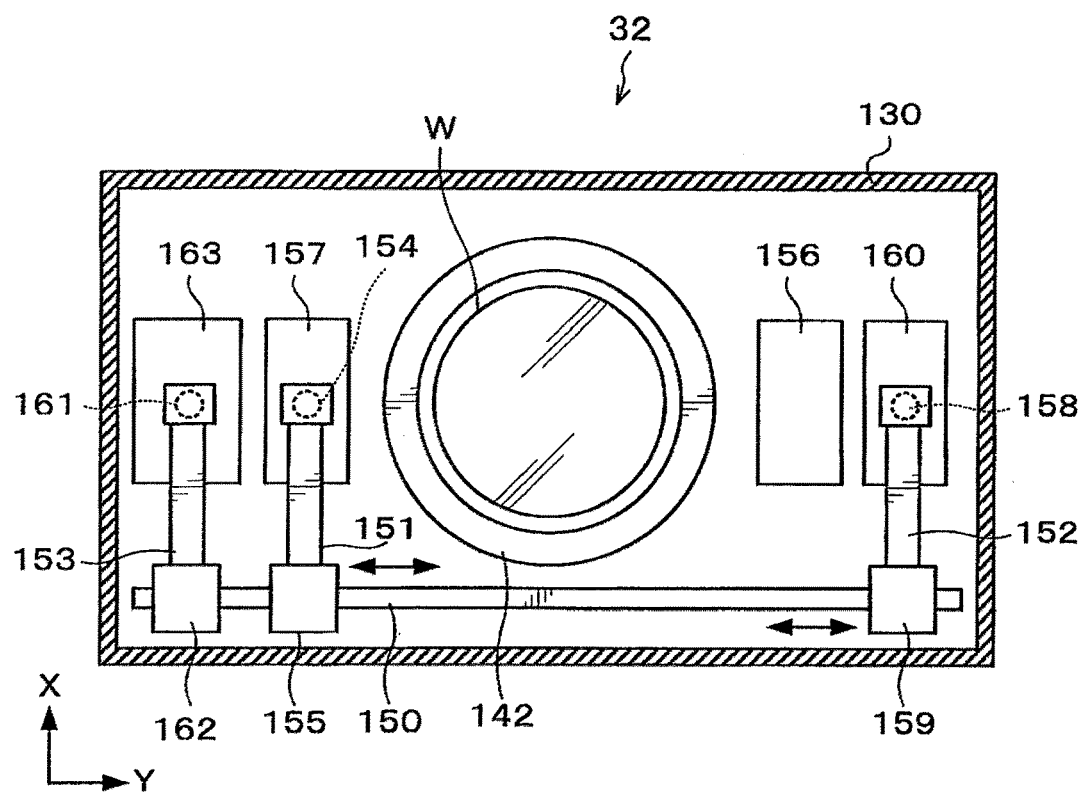
F I G. 5

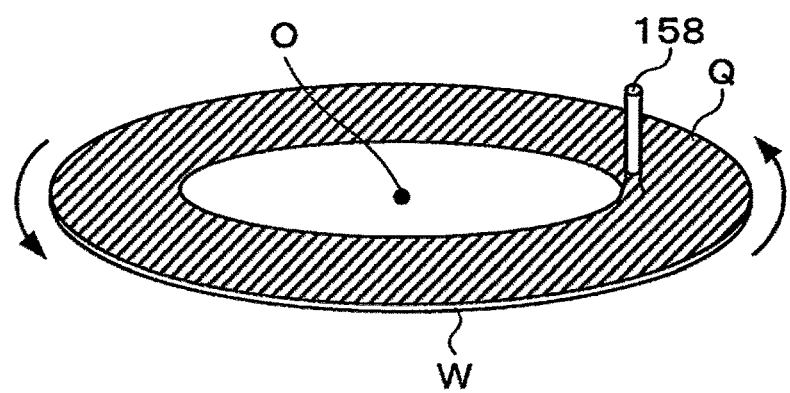
F I G. 8
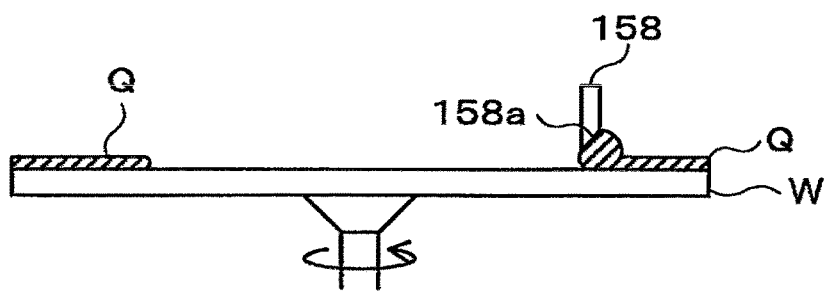
F I G. 9
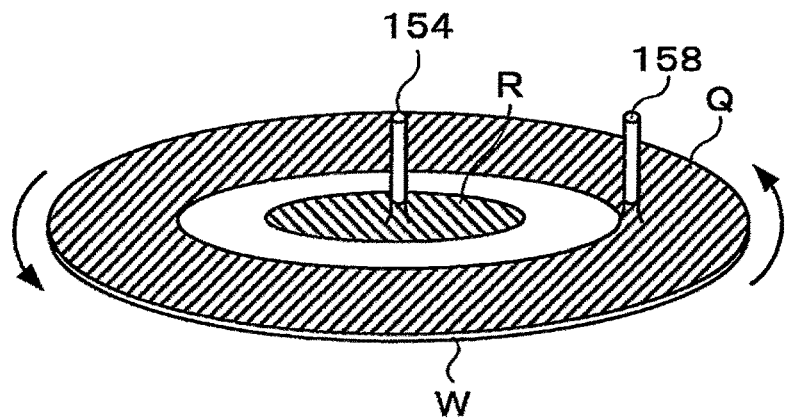
F I G. 10

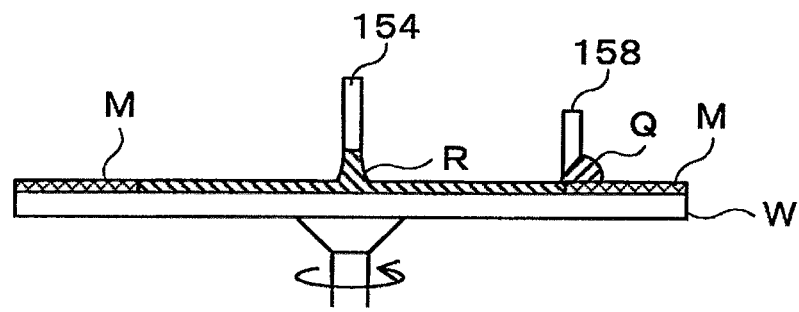
F I G. 11
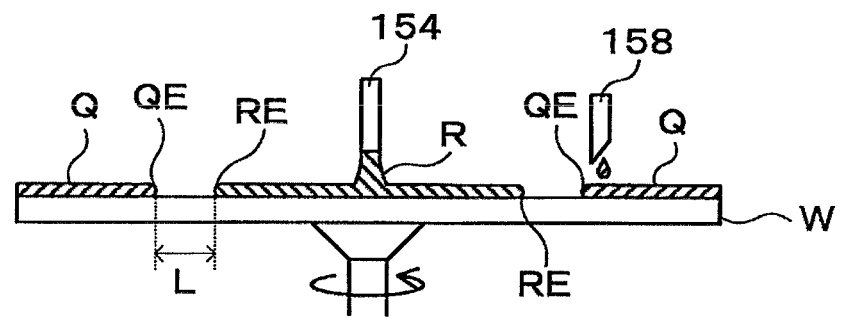
F I G. 12
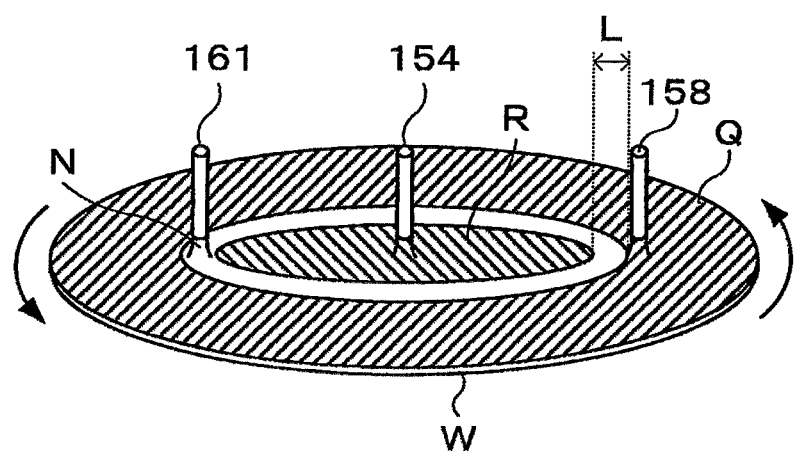
F I G. 13

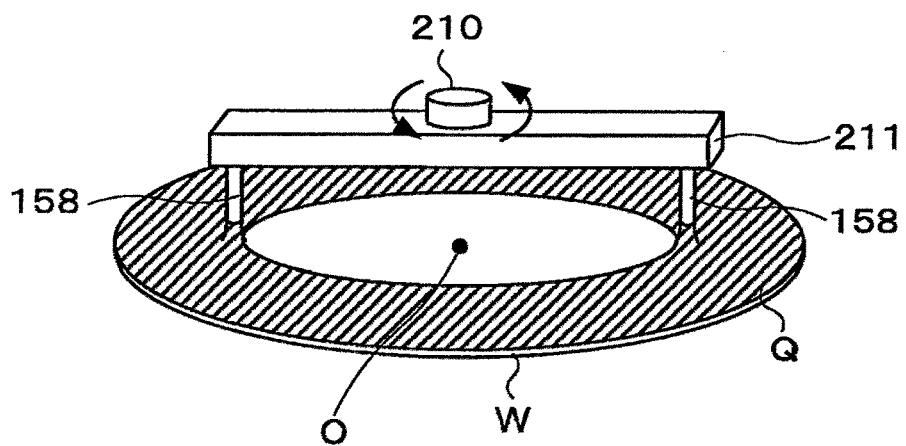
F I G. 15
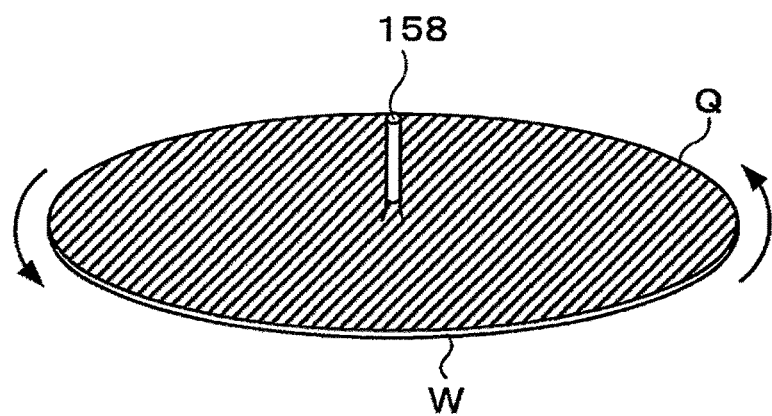
F I G. 16
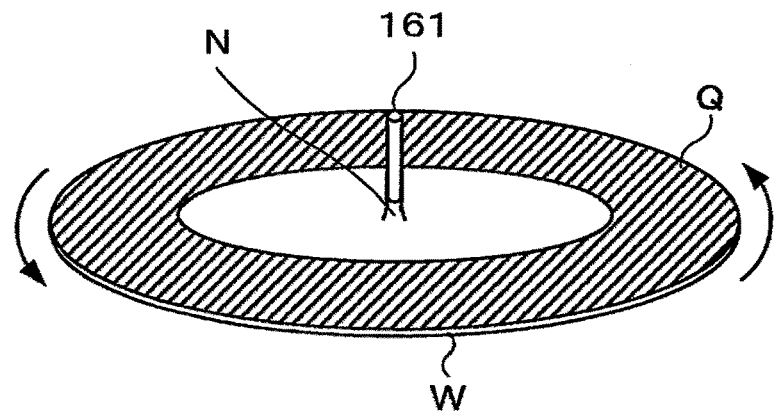
F I G. 17

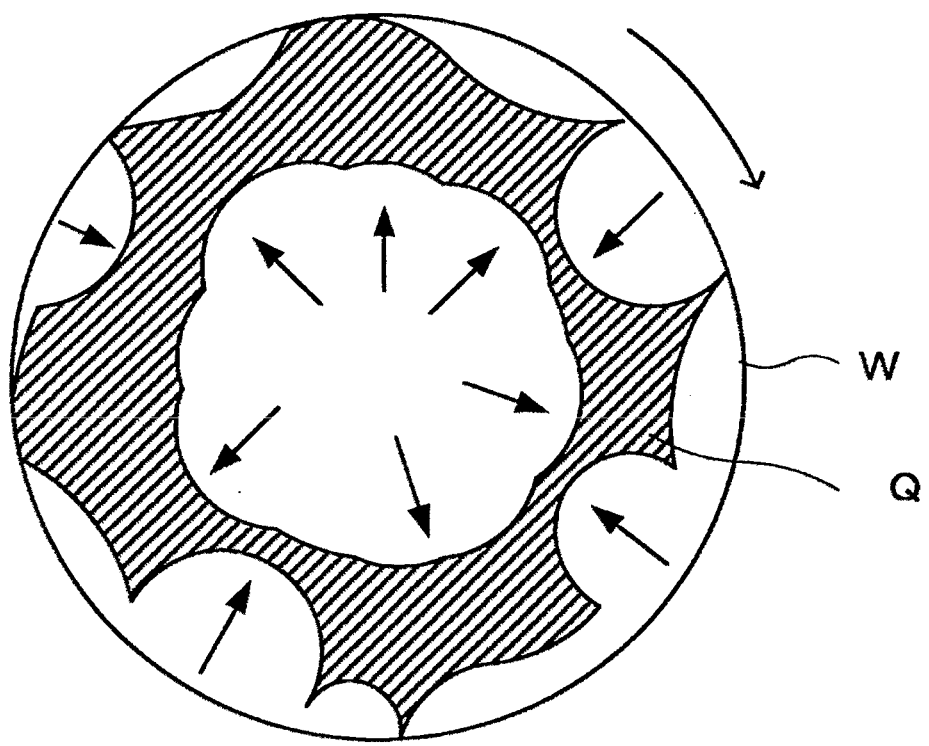
F I G. 20

COATING METHOD, COMPUTER STORAGE MEDIUM AND COATING APPARATUS

CROSS-REFERENCE TO RELATED APPLICATION

This application claims the priority benefit of Japanese Patent Application No. 2014-250571, filed on Dec. 11, 2014, the disclosure of which is incorporated herein by reference in its entirety.

BACKGROUND OF THE INVENTION

1. Field of the Invention

The present invention relates to a coating method for applying a coating solution to a substrate, a computer storage medium and a coating apparatus.

2. Description of Related Art

In a photolithography step e.g. in a semiconductor device manufacturing process are performed sequential processes including a coating process for applying a given solution to e.g. a semiconductor wafer (hereinafter simply referred to as "wafer") as a substrate to form a coating film such as an antireflective film or a resist film, an exposure process for exposing the resist film in a predetermined pattern, and a development process for developing the exposed resist film, whereby a predetermined resist pattern is formed on the wafer.

The above coating process is commonly performed by a so-called spin-coating method which involves supplying a coating solution from a nozzle to the center of a rotating wafer, and allowing the coating solution to spread on the wafer by centrifugal force, thereby forming a coating film on the wafer. Prior to such a coating process, a so-called pre-wetting treatment, which involves applying a solvent, such as a thinner, onto the wafer to improve the wetting properties of the wafer, is performed in order to enhance the in-pane uniformity of the coating film and to reduce the amount of the coating solution used. The application of the solvent in the pre-wetting treatment is also performed by supplying the solvent to the center of a rotating wafer, and allowing the solvent to spread on the wafer.

However, the method of supplying a solvent to the center of a wafer has the drawback that the degree of improvement in the wetting properties of the wafer is likely to differ between the center and the periphery of the wafer. Therefore, it is difficult to make the in-plane uniformity of a coating film within a desired range. A method has been proposed which performs pre-wetting of a wafer by supplying a solvent to a position between the center and the periphery of the wafer while rotating the wafer at a low speed, and allowing the solvent to spread in an annular shape on the wafer, and which then performs coating of the wafer by supplying a coating solution from the center of the wafer (patent document 1). This method can make wetting of a coating solution to a wafer equal between the center and the periphery of the wafer, thus enabling the formation of an in-plane uniform coating film on the wafer.

PRIOR ART DOCUMENT

Patent Document

Patent document 1: Japanese Patent Laid-Open Publication No. 2003-136010

SUMMARY OF THE INVENTION

Problems to be Solved by the Invention

At the stage of forming a coating film on a wafer in a semiconductor device manufacturing process, a primer coating has previously been formed on the wafer inmost cases. Therefore, wetting of a solvent, which is used in a pre-wetting treatment, to the primer coating (the contact angle between the primer coating and the solvent) varies depending on the type of the primer coating. When wetting of the solvent to the primer coating is poor (the contact angle between the primer coating and the solvent is large), it is difficult to keep the solvent in an annular shape on the wafer after supplying the solvent to a position between the center and the periphery of the wafer.

In particular, as shown in FIG. 20, a solvent Q that has been supplied to a peripheral portion of a wafer W may move toward the center of the wafer W due to the surface tension, and the solvent near the center of the wafer W may move toward the periphery of the wafer W due to the centrifugal force. The resulting non-uniform distribution of the solvent on the wafer W leads to a non-uniform distribution of the thickness of a coating film especially in a peripheral area of the wafer W.

The present invention has been made in view of the above situation. It is therefore an object of the present invention to provide a coating method and apparatus which can apply a coating solution uniformly onto a substrate surface while reducing the amount of the coating solution supplied.

Means for Solving the Problems

In order to achieve the object, the present invention provides a coating method for applying a coating solution onto a substrate, comprising the steps of: a solvent liquid film forming step of supplying a solvent for the coating solution onto the substrate to form an annular liquid film of the solvent in a peripheral area of the substrate; a coating solution supply step of supplying the coating solution to the center of the substrate while rotating the substrate at a first rotational speed; and a coating solution spreading step of allowing the coating solution to spread on the substrate by rotating the substrate at a second rotational speed which is higher than the first rotational speed, wherein the supply of the solvent is continued until just before the coating solution comes into contact with the liquid film of the solvent in the solvent liquid film forming step or the coating solution spreading step.

According to the present invention, an annular liquid film of a solvent for a coating solution is formed in a peripheral area of a substrate and, in addition, the coating solution is supplied to the center of the substrate while rotating the substrate at the first rotational speed, and subsequently the substrate is rotated at the second rotational speed to allow the coating solution to spread on the substrate. The supply of the solvent is continued until just before the coating solution comes into contact with the liquid film of the solvent. In other words, the supply of the solvent is stopped just before the coating solution comes into contact with the solvent. This makes it possible to keep the liquid film of the solvent in a good annular shape until just before the coating solution comes into contact with the solvent. Accordingly, non-uniform distribution of the solvent on the substrate can be prevented, and the coating solution can be spread uniformly over the surface of the substrate. Therefore, an in-plane uniform coating film can be formed on the substrate.

In the solvent liquid film forming step, the annular liquid film of the solvent may be formed by supplying the solvent from a solvent supply nozzle, positioned above a peripheral portion of the substrate, while rotating the substrate at a rotational speed of more than 0 rpm and not more than the first rotational speed.

In the solvent liquid film forming step, the annular liquid film of the solvent may be formed by supplying the solvent from a solvent supply nozzle, which is moving along a peripheral portion of the substrate, while keeping the substrate stationary or rotating the substrate at a rotational speed of more than 0 rpm and not more than the first rotational speed.

The solvent supply nozzle may include a plural number of nozzles.

Before the start of the coating solution spreading step, a gap may be secured between the liquid film of the solvent and the coating solution by blowing a dry gas onto a position between the solvent supply nozzle and the center of the substrate in a plan view.

In the solvent liquid film forming step, the solvent may be supplied from the solvent supply nozzle to a position at a radial distance of about 30 mm to 100 mm from the center of the substrate.

The supply of the solvent may be continued until the distance between the outer peripheral end of the coating solution and the inner peripheral end of the annular liquid film of the solvent becomes 5 mm to 60 mm.

In the solvent liquid film forming step, the annular liquid film of the solvent may be formed by supplying the solvent to the center of the substrate to form a puddle of the solvent, subsequently rotating the substrate to allow the solvent to diffuse on the substrate, thereby forming a liquid film of the solvent on the entire surface of the substrate, and then blowing a dry gas onto the center of the substrate to remove the liquid film of the solvent from a central portion of the substrate.

Prior to the solvent liquid film forming step, a pre-wetting step may be performed by supplying the solvent from the solvent supply nozzle, positioned above a peripheral portion of the substrate, to the peripheral portion while rotating the substrate at a rotational speed of more than 0 rpm and not more than the first rotational speed, and then allowing the solvent to spread to the periphery of the substrate by increasing the rotational speed of the substrate from the first rotational speed.

In the pre-wetting step, the supply of the solvent from the solvent supply nozzle may be stopped during the period when the solvent is allowed to spread to the periphery of the substrate.

The present invention, in another aspect, provides a computer-readable storage medium storing a program that operates on a computer as a controller for controlling a coating apparatus so that it performs the above-described coating method.

The present invention, in yet another aspect, provides a coating apparatus for applying a coating solution onto a substrate, comprising: a substrate holder for holding and rotating the substrate; a coating solution supply nozzle for supplying the coating solution onto the substrate; a solvent supply nozzle for supplying a solvent for the coating solution onto the substrate; a first movement mechanism for moving the coating solution supply nozzle; a second movement mechanism for moving the solvent supply nozzle; and a controller configured to control the substrate holder, the coating solution supply nozzle, the solvent supply nozzle, the first movement mechanism and the second movement mechanism so that they perform a method comprising the steps of: supplying the solvent for the coating solution onto the substrate to form an annular liquid film of the solvent in a peripheral area of the substrate; supplying the coating solution to the center of the substrate while rotating the substrate at a first rotational speed; and allowing the coating solution to spread on the substrate by rotating the substrate at a second rotational speed which is higher than the first rotational speed.

The coating apparatus may further comprise a dry gas nozzle for blowing a dry gas onto the substrate, and a third movement mechanism for moving the dry gas nozzle.

The coating apparatus may further comprise a support section to which the solvent supply nozzle is mounted and which is configured to be rotatable above the substrate on a vertical axis passing through the center of the substrate as the axis of rotation, and a rotary drive mechanism for rotating the support section; and the annular liquid film of the solvent is formed in a peripheral area of the substrate by supplying the solvent from the solvent supply nozzle while rotating the support section by means of the rotary drive mechanism.

Advantageous Effects of the Invention

According to the present invention, a coating solution can be applied uniformly onto a substrate surface while reducing the amount of the coating solution supplied.

BRIEF DESCRIPTION OF THE DRAWINGS

FIG. 4 is a vertical cross-sectional view schematically showing the construction of a resist processing apparatus;

FIG. 5 is a transverse cross-sectional view schematically showing the construction of the resist processing apparatus;

FIG. 8 is a perspective view illustrating the formation of an annular liquid film of a solvent in a peripheral area of a wafer;

FIG. 9 is a vertical cross-sectional view illustrating the formation of an annular liquid film of a solvent in a peripheral area of a wafer;

FIG. 10 is a perspective view illustrating supply of a resist solution to the center of a wafer;

FIG. 11 is a vertical cross-sectional view illustrating contact between a solvent and a resist solution on a wafer;

FIG. 12 is a vertical cross-sectional view illustrating stoppage of the supply of a solvent before contact between the solvent and a resist solution on a wafer;

FIG. 13 is a diagram illustrating blowing of a dry gas onto a position between a resist solution and a solvent on a wafer;

FIG. 15 is a perspective view illustrating supply of a solvent onto a wafer by the use of a solvent supply nozzle according to another embodiment;

FIG. 16 is a perspective view illustrating supply of a solvent to the center of a wafer;

FIG. 17 is a perspective view illustrating the formation of an annular liquid film of a solvent by blowing of a dry gas onto the center of a wafer;

FIG. 20 is a diagram illustrating the shape of a solvent on a wafer, the solvent having poor wetting to the wafer and having been supplied to a peripheral portion of the wafer.

DETAILED DESCRIPTION OF THE INVENTION

Figure 1:
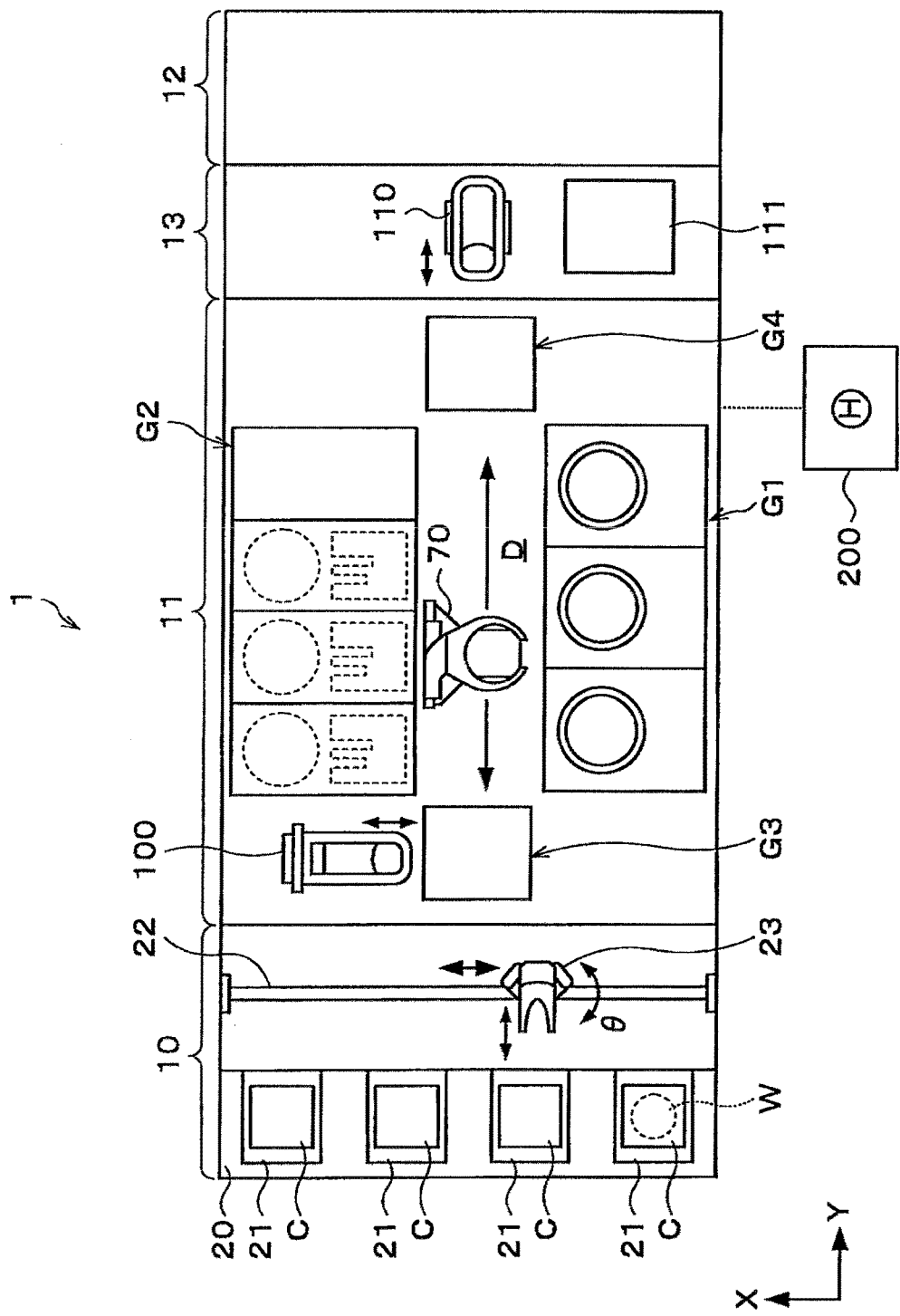
FIG. 1 is a plan view schematically showing the construction of a substrate processing system according to an embodiment of the present invention.
Figure 2:
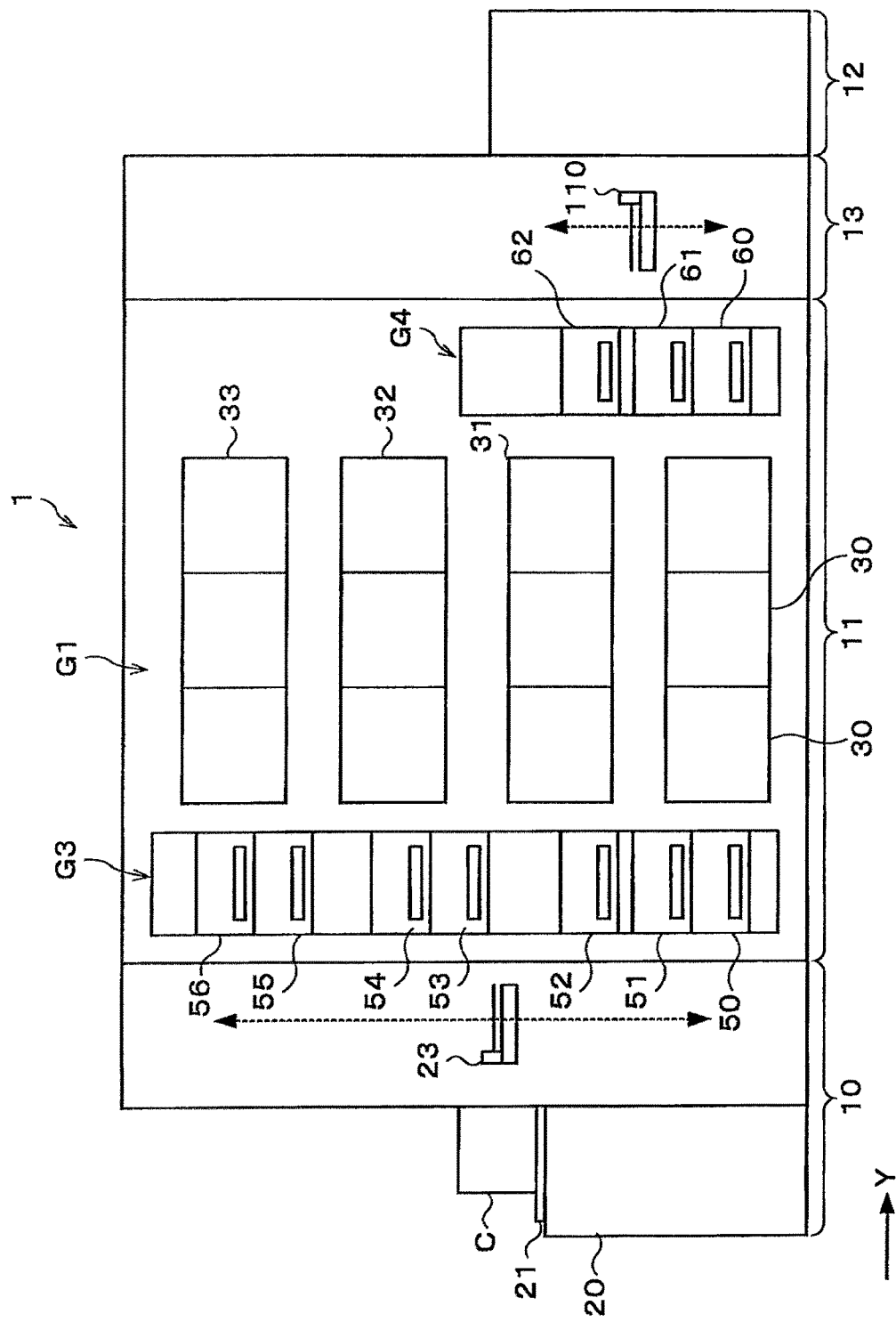
FIG. 2 is a front view schematically showing the construction of the substrate processing system according to an embodiment of the present invention.
Figure 3:
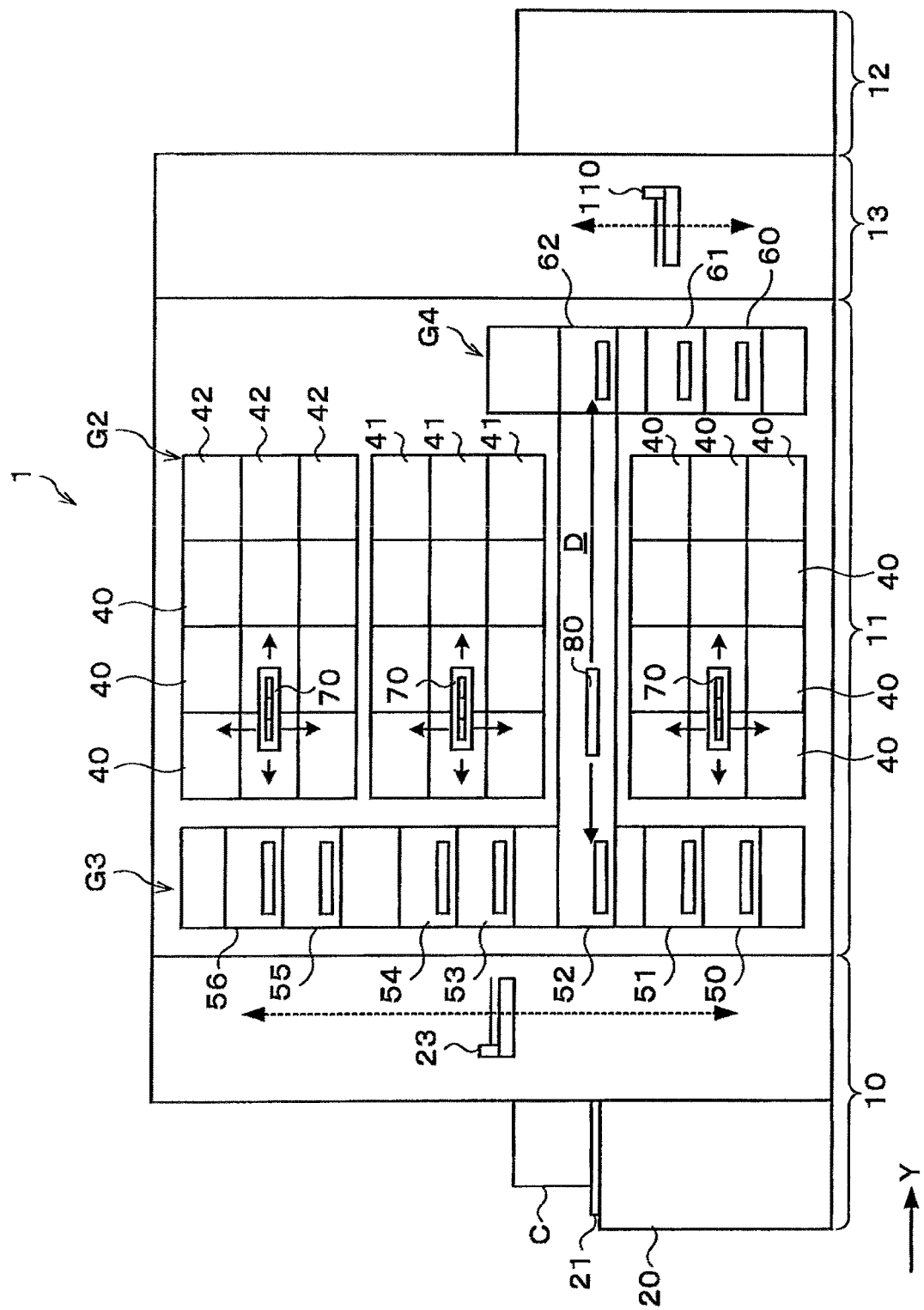
FIG. 3 is a rear view schematically showing the construction of the substrate processing system according to an embodiment of the present invention.

Preferred embodiments of the present invention will now be described. FIG. 1 is an explanatory diagram schematically showing the construction of a substrate processing system 1 provided with a coating apparatus for carrying out a coating method according to an embodiment of the present invention. FIGS. 2 and 3 are a front view and a back view, respectively, schematically showing the internal construction of the substrate processing system 1. The following description illustrates a case where a resist solution is used as a coating solution, and a resist coating apparatus for applying a resist solution to a substrate is used as a coating apparatus.

As shown in FIG. 1, the substrate processing system 1 comprises a cassette station 10 into/out of which a cassette C housing a number of wafers W is carried, a processing station 11 having various types of processing apparatuses each for performing predetermined processing on a wafer W, and an interface station 13 for transferring a wafer W between the processing station 11 and an exposure apparatus 12 located adjacent to the interface station 13, which are integrally connected together.

A cassette stage 20 is provided in the cassette station 10. The cassette stage 20 is provided with a plurality of cassette plates 21 each for placing a cassette C thereon when carrying the cassette C into/out of the substrate processing system 1.

The cassette station 10 is provided with a wafer transport device 23 which is movable on a transport route 22 extending in an X-direction as shown in FIG. 1. The wafer transport device 23 is also vertically movable and rotatable about a vertical axis (in θ-direction), and can transport a wafer W between any one of the cassettes C on the cassette plates 21 and the below-described transfer device of the third block G3 of the processing station 11.

The processing station 11 is provided with a plurality of, e.g. four, blocks G1, G2, G3, G4 having various apparatuses. The first block G1 is provided on the front side of the processing station 11 (on the side of the negative direction of the X-direction shown in FIG. 1), and the second block G2 is provided on the back side of the processing station 11 (on the side of the positive direction of the X-direction shown in FIG. 1). The third block G3 is provided on the cassette station 10 side of the processing station 11 (on the side of the negative direction of the Y-direction shown in FIG. 1), and the fourth block G4 is provided on the interface station 13 side of the processing station 11 (on the side of the positive direction of the Y-direction shown in FIG. 1).

As shown in FIG. 2, the first block G1 includes a plurality of liquid processing apparatuses, for example, developing apparatuses 30 each for developing a wafer W, lower antireflective film forming apparatuses 31 each for forming an antireflective film underlying a resist film of a wafer W (hereinafter referred to as a "lower antireflective film"), resist coating apparatuses 32 each for applying a resist solution onto a wafer W to form a resist film, and upper antireflective film forming apparatuses 33 each for forming an antireflective film overlying a resist film of a wafer W (hereinafter referred to as an "upper antireflective film"), which are arranged in this order from the lowest apparatuses.

The developing apparatuses 30, the lower antireflective film forming apparatuses 31, the resist coating apparatuses 32 and the upper antireflective film forming apparatuses 33 respectively consist of e.g. a set of horizontally-arranged three apparatuses. The number and the disposition of the developing apparatuses 30, the lower antireflective film forming apparatuses 31, the resist coating apparatuses 32 and the upper antireflective film forming apparatuses 33 can be arbitrarily selected.

Spin-coating for applying a given coating solution onto a wafer W, for example, is performed in the developing apparatuses 30, the lower antireflective film forming apparatuses 31, the resist coating apparatuses 32 and the upper antireflective film forming apparatuses 33. The spin-coating is performed by, for example, ejecting a coating solution from a coating nozzle onto a wafer W while rotating the wafer W, and allowing the coating solution to spread on the wafer W. The construction of the resist coating apparatus 32 will be described below.

As shown in FIG. 3, the second block G2 is provided with thermal treatment apparatuses 40 each for performing thermal treatment, such as heating or cooling, of a wafer W, adhesion apparatuses 41 each for enhancing adhesion of a resist solution to a wafer W, and peripheral exposure apparatuses 42 each for exposing a peripheral area of a wafer W, which are arranged vertically and horizontally. The number and the disposition of the thermal treatment apparatuses 40, the adhesion apparatuses 41 and the peripheral exposure apparatuses 42 can also be arbitrarily selected.

The third block G3 is provided with transfer devices 50, 51, 52, 53, 54, 55, 56 arranged in this order from the lowest device. The fourth block G4 is provided with transfer devices 60, 61, 62 arranged in this order from the lowest device.

As shown in FIG. 1, a wafer transport area D is formed in an area surrounded by the first block G1 to the fourth block G4. A plurality of wafer transport devices 70, each having transport arms movable e.g. in the Y-direction, the X-direction, the θ-direction and the vertical direction, are disposed in the wafer transport area D. Each wafer transport device 70 can move in the wafer transport area D to transport a wafer W to a predetermined apparatus in the first block G1, the second block G2, the third block G3 and the fourth block G4.

As shown in FIG. 3, a shuttle transport device 80 for linearly transporting a wafer W between the third block G3 and the fourth block G4 is provided in the wafer transport area D.

The shuttle transport device 80 is linearly movable e.g. in the Y-direction shown in FIG. 3. The shuttle transport device 80, supporting a wafer W, can move in the Y-direction to transport the wafer W between the transfer device 52 of the third block G3 and the transfer device 62 of the fourth block G4.

As shown in FIG. 1, a wafer transport device 100 is provided next to the third block G3 on the side of the positive direction of the X-direction. The wafer transport device 100 has transport arms movable e.g. in the X-direction, the θ-direction and the vertical direction. The wafer transport device 100, supporting a wafer W, can move vertically to transport the wafer W to any of the transfer devices in the third block G3.

The interface station 13 is provided with a wafer transport device 110 and a transfer device 111. The wafer transport device 110 has transport arms movable e.g. in the Y-direction, the θ-direction and the vertical direction. The wafer transport device 110, supporting a wafer W e.g. by the transport arms, can transport the wafer W between any of the transfer devices in the third block G4, the transfer device 111 and the exposure apparatus 12.

The construction of the above-described resist coating apparatus 32 will now be described. As shown in FIG. 4, the resist coating apparatus 32 includes a processing container 130 capable of hermetically sealing its interior. A transfer opening (not shown) for a wafer W is formed in the side of the processing container 130.

A spin chuck 140 as a substrate holder for holding and rotating a wafer W is provided in the processing container 130. The spin chuck 140 can be rotated at a predetermined speed by means of a chuck drive 141 such as a motor. The chuck drive 141 is provided with a lift drive mechanism, such as a cylinder, so that the spin chuck 140 can move up and down.

A cup 142 for receiving and recovering a liquid scattering or falling from the wafer W is provided around the spin chuck 140. To the lower surface of the cup 142 are connected a discharge pipe 143 for discharging the recovered liquid and an exhaust pipe 144 for discharging the internal atmosphere of the cup 142.

As shown in FIG. 5, a rail 150 extending in the Y-direction (lateral direction in FIG. 5) is provided beside the cup 142 on the side of the negative direction of the X-direction (downward direction in FIG. 5). The rail 150 extends, for example, from a position outside the cup 142 on the side of the negative direction of the Y-direction (leftward direction in FIG. 5) to a position outside the cup 142 on the side of the positive direction of the Y-direction (rightward direction in FIG. 5). Three arms 151, 152, 153 are mounted to the rail 150.

A resist solution supply nozzle 154 as a coating solution supply nozzle for supplying a resist solution as a coating solution is supported by the first arm 151. The first arm 151 is movable on the rail 150 by a nozzle drive 155 as a first movement mechanism. The resist solution supply nozzle 154 can therefore move from a standby section 156, provided in a position outside the cup 142 on the side of the positive direction of the Y-direction, to a standby section 157 provided in a position outside the cup 142 on the side of the negative direction of the Y-direction, passing through a position above the center of the wafer W in the cup 142. The first arm 151 is vertically movable by the nozzle drive 155, so that the height of the resist solution supply nozzle 154 can be adjusted. In this embodiment a mid UV (MUV) resist or a KrF resist, for example, may be used as the resist solution.

A solvent supply nozzle 158 for supplying a solvent for the resist solution is supported by the second arm 152. The second arm 152 is movable on the rail 150 by a nozzle drive 159 as a second movement mechanism. The solvent supply nozzle 158 can therefore move from a standby section 160, provided in a position outside the cup 142 on the side of the positive direction of the Y-direction, to a position above the center of the wafer W in the cup 142. The standby section 160 is located beside the standby section 156 on the side of the positive direction of the Y-direction. The second arm 152 is vertically movable by the nozzle drive 159, so that the height of the solvent supply nozzle 158 can be adjusted. In this embodiment cyclohexane, for example, may be used as the solvent for the resist solution.

A dry gas nozzle 161 for blowing a dry gas onto the wafer W is supported by the third arm 153. The third arm 153 is movable on the rail 150 by a nozzle drive 162 as a third movement mechanism. The dry gas nozzle 161 can therefore move from a standby section 163, provided in a position outside the cup 142 on the side of the negative direction of the Y-direction, to a position above the wafer W in the cup 142. The standby section 163 is located beside the standby section 157 on the side of the negative direction of the Y-direction. The third arm 153 is vertically movable by the nozzle drive 162, so that the height of the dry gas nozzle 161 can be adjusted. In this embodiment nitrogen gas, or air which has been dehumidified by a dehumidifying device (not shown), for example, may be used as the dry gas.

The construction of each of the other liquid processing apparatuses, namely, the developing apparatus 30, the lower antireflective film forming apparatus 31 and the upper antireflective film forming apparatus 33, is the same as the above-described construction of the resist coating apparatus 32 except for the shape and the number of nozzle(s) and the type of the liquid(s) supplied from the nozzle(s), and therefore a description thereof is omitted.

As shown in FIG. 1, the substrate processing system 1 is provided with a controller 200. The controller 200 is, for example, a computer, and includes a program storage unit (not shown). A program for controlling processing of a wafer W in the substrate processing system 1 is stored in the program storage unit. In the program storage unit is also stored a program for controlling the operations of drive systems for the above-described various processing apparatuses and transport devices to effect the below-described substrate processing. The programs may have been stored in a computer-readable storage medium H such as a hard disk (HD), a flexible disk (FD), a compact disk (CD), a magneto-optical disk (MO), a memory card, or the like, and may be installed on the controller 200 from the storage medium.

Figure 6:
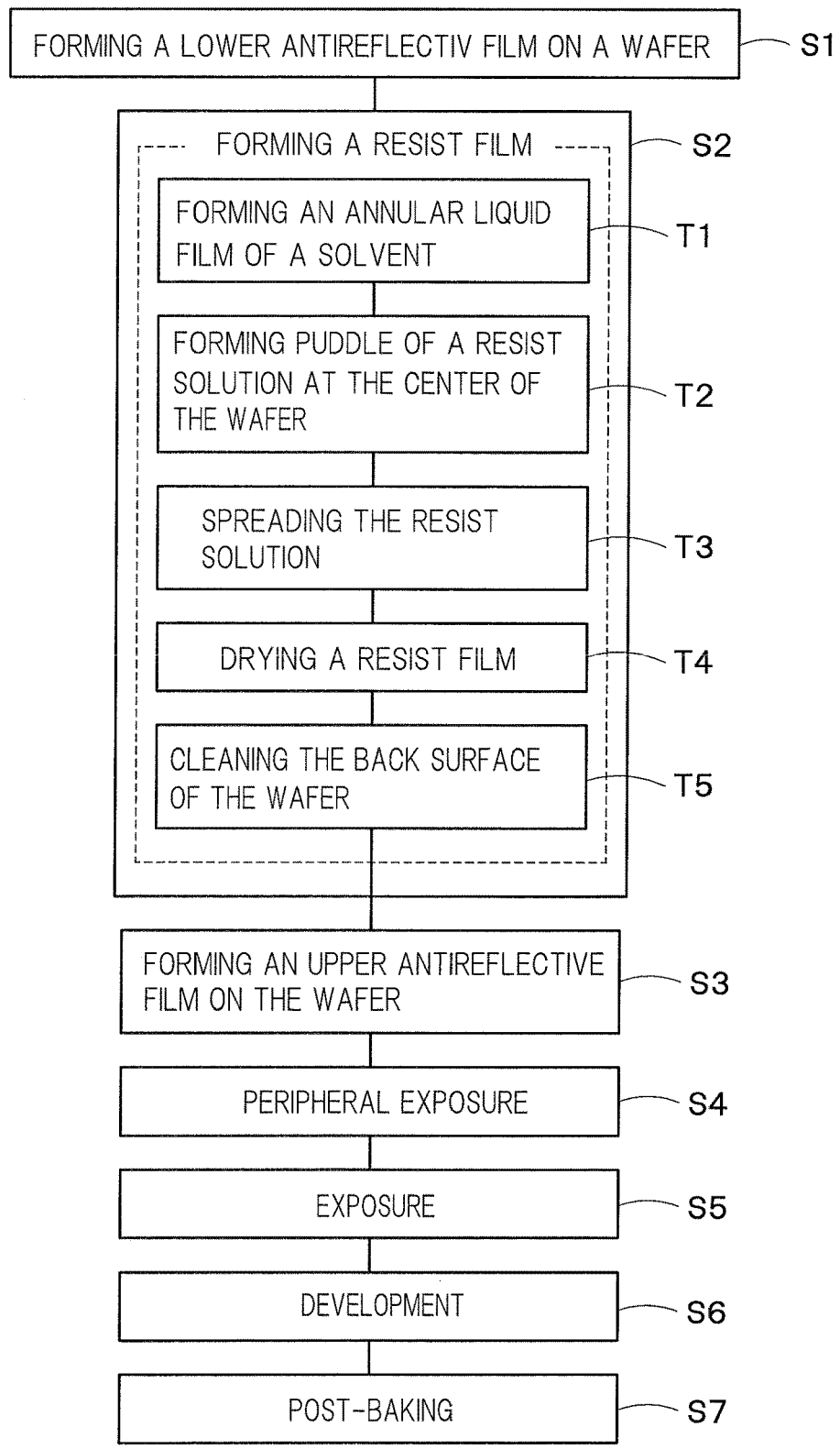
FIG. 6 is a flow chart illustrating main steps in a wafer processing process.
Figure 7:
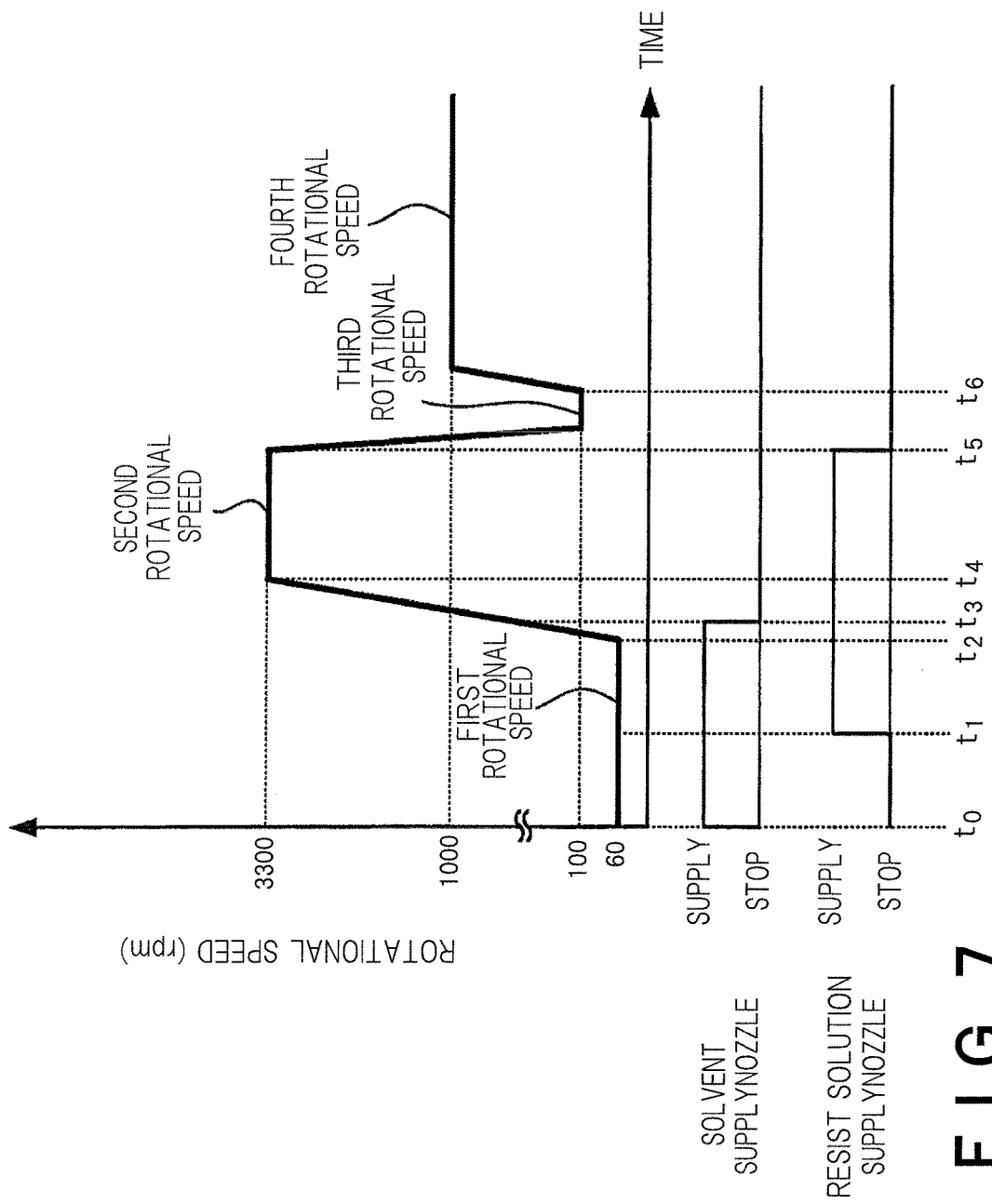
FIG. 7 is a time chart showing the rotational speed of a wafer and the operations of devices in a resist coating process.

Processing of a wafer, performed in the substrate processing system 1 having the above construction, will now be described. FIG. 6 is a flow chart illustrating main steps in an exemplary wafer processing process. FIG. 7 is a time chart showing the rotational speed of a wafer W and the operations of devices in resist coating performed in the resist coating apparatus 32.

First, a cassette C housing a number of wafers W is carried into the cassette station 10 of the substrate processing system 1, and the wafers W in the cassette C are sequentially transported by the wafer transport device 23 to the transfer device 53 of the processing station 11.

Next, each wafer W is transported to the thermal treatment apparatus 40 of the second block G2, where the temperature of the wafer W is regulated. Thereafter, the wafer W is transported by the wafer transport device 70 e.g. to the lower antireflective film forming apparatus 31 of the first block G1, where a lower antireflective film is formed on the wafer W (step S1 of FIG. 6). Thereafter, the wafer W is transported to the thermal treatment apparatus 40 of the second block G2, where the wafer W is heated to regulate the temperature of the wafer W.

Next, the wafer W is transported to the adhesion apparatus 41, where the wafer W is subjected to adhesion treatment.

Thereafter, the wafer W is transported to the resist coating apparatus 32 of the first block G1, where a resist film is formed on the wafer W (step S2 of FIG. 6).

Resist coating in the resist coating apparatus 32 will now be described in detail. At the start of resist coating of the wafer W, the wafer W is first held by attraction on the upper surface of the spin chuck 140. Next, as shown in FIG. 8, the solvent supply nozzle 158 is moved to a position above a peripheral portion of the wafer W. When the diameter of the wafer W is, for example, 300 mm, the peripheral portion of the wafer W refers to a position at a radial distance of about 30 mm to 100 mm from the center O.

Next, a solvent Q is supplied from the solvent supply nozzle 158 onto the wafer W while rotating the wafer e.g. at a rotational speed of more than 0 rpm and not more than the below-described first rotational speed, in particular 60 rpm, which is equal to the first rotational speed, in this embodiment (time $t_0$ of FIG. 7), thereby forming an annular liquid film of the solvent Q in a peripheral area of the wafer W as shown in FIG. 8 (solvent liquid film forming step, step T1 of FIG. 6). The supply of the solvent from the solvent supply nozzle 158 is performed while maintaining the height of the front end of the solvent supply nozzle 158 from the wafer W at 1.0 mm to 5.0 mm, e.g. at about 1 mm in this embodiment. Cyclohexane, the solvent Q for a resist solution, has a high contact angle with the wafer W after the adhesion treatment. Therefore, if the solvent Q is supplied from the solvent supply nozzle 158 positioned distant from the upper surface of the wafer W, the shape of the liquid film of the solvent Q can sometimes deform e.g. due to splashing of the solvent. Splashing of the solvent can be prevented by the surface tension of the solvent Q when it is supplied from the solvent supply nozzle 158 positioned close to the upper surface of the wafer W, e.g. at a distance of about 1 mm, as shown in FIG. 9. This enables precise adjustment the shape of the liquid film of the solvent Q. As shown in FIG. 9, in this embodiment the front end of the solvent supply nozzle 158 has an inclined surface 158a inclined in the radial direction of the wafer W such that the outer end of the inclined surface 158a lies higher than the inner end thereof. The inclined surface 158a can impart a flow toward the periphery of the wafer W to the solvent Q supplied from the solvent supply nozzle 158, thereby forming the solvent Q into a more precise annular shape.

Next, as shown in FIG. 10, while continuing the supply of the solvent Q from the solvent supply nozzle 158, the resist solution supply nozzle 154 is moved to a position above the center of the wafer W, and a resist solution R is supplied from the resist solution supply nozzle 154 onto the wafer W (coating solution supply step, time $t_1$ of FIG. 7), thereby forming a puddle of the resist solution R at the center of the wafer W (step T2 of FIG. 6). During the step T2, the wafer W continues to be rotated at the first rotational speed which is 60 rpm in this embodiment as described above.

The supply of the resist solution R from the resist solution supply nozzle 154 and the supply of the solvent Q from the solvent supply nozzle 158 are continued, and the wafer W is accelerated from the first rotational speed to the second rotational speed when the cumulative amount of the resist solution R supplied reaches e.g. 2 cc (time $t_2$ of FIG. 7). The second rotational speed is preferably 1500 rpm to 4000 rpm, and is e.g. 3300 rpm in this embodiment. The acceleration of the wafer W is about 4000 rpm/sec. After the rotational speed of the wafer W has reached the second rotational speed, the second rotational speed is maintained for a predetermined time, e.g. about three seconds in this embodiment (time $t_4$-$t_5$ of FIG. 7). By thus accelerating the wafer W to the second rotational speed, the resist solution R supplied to the center of the wafer W is allowed to spread toward the periphery of the wafer W (coating solution spreading step, step T3 of FIG. 6).

If the supply of the solvent Q from the solvent supply nozzle 158 is continued while allowing the resist solution R to spread on the wafer W, the resist solution R spreading toward the periphery of the wafer W become mixed with the solvent Q, whereby the resist solution R is diluted. Most of the diluted resist solution M will be forced out of the periphery of the wafer W without adhering to the wafer W. Most of the resist solution R is thus wasted.

In this embodiment, therefore, the supply of the solvent Q from the solvent supply nozzle 158 is stopped before the resist solution R comes into contact with the liquid film of the solvent Q. Thus, as shown in FIG. 12, the supply of the solvent Q from the solvent supply nozzle 158 is stopped before the peripheral end RE of the resist solution R comes into contact with the inner peripheral end QE of the annular solvent Q. More specifically, the supply of the solvent Q from the solvent supply nozzle 158 is continued until the distance L between the peripheral end RE of the resist solution R and the inner peripheral end QE of the annular solvent Q becomes in the range of about 5 to 60 mm. By thus continuing the supply of the solvent Q until just before the resist solution R comes into contact with the solvent Q, the liquid film of the solvent Q can be kept in an annular shape with little deformation. Accordingly, when the wafer W is rotated at the second rotational speed, the resist solution R can be spread uniformly over the surface of the wafer W, and therefore an in-plane uniform resist film can be formed on the wafer W.

It is to be noted in this regard that a liquid such as the resist solution R flows preferentially to an easy-to-flow place. For example, if the liquid film of the solvent Q has a deformed annular shape as shown in FIG. 20, the resist solution R, spreading on the wafer W from the center toward the periphery of the wafer W, preferentially flows to a place rich in the solvent Q, and is less likely to flow to a place poor in the solvent Q. Further, if the solvent Q is in the state shown in FIG. 20, there is variation in the distance L between the inner peripheral end QE of the solvent Q and the peripheral end RE of the resist solution R. Therefore, the time it takes for the resist solution R to come into contact with the solvent Q varies among places on the wafer W. The resist solution R will preferentially flow to places where the resist solution R has come into contact with the liquid film of the solvent Q, resulting in the formation of a resist film having a non-uniform thickness.

According to this embodiment, on the other hand, the liquid film of the solvent Q is kept in an annular shape with little deformation by continuing the supply of the solvent Q until just before the resist solution R comes into contact with the solvent Q. This enables uniform contact between the liquid film of the solvent Q and the resist solution R in the plane of the wafer W. Accordingly, the resist solution R can be spread uniformly over the surface of the wafer W, and therefore an in-plane uniform resist film can be formed on the wafer W. In the resist coating process illustrated in FIG. 7, the supply of the solvent Q is stopped at time $t_3$ immediately after the start of acceleration of the wafer W toward the second rotational speed; however, the present invention is not limited to this feature. The timing of contact of the resist solution R with the liquid film of the solvent Q varies with various factors such as the rotational speed of the wafer W, the amount of the resist solution R supplied and the viscosity of the resist solution R. Thus, it is possible that the resist solution R may come into contact with the solvent Q even when the wafer W is rotating at the first rotational speed e.g. in the case where the resist solution R has a low viscosity and a high fluidity. In such a case, the supply of the solvent Q is stopped before accelerating the wafer W to the second rotational speed.

In order to keep the distance L between the inner peripheral end QE of the solvent Q and the peripheral end RE of the resist solution R constant in the plane of the wafer W, it is possible to move the dry gas nozzle 161 to a position nearer to the center of the wafer W than the solvent supply nozzle 158, that is, a position between the solvent supply nozzle 158 and the center of the wafer W in a plan view, and to blow a dry gas N from the dry gas nozzle 161 onto the upper surface of the wafer W. Since the distance L of the gap between the liquid film of the solvent Q and the resist solution R can be kept uniform in the plane of the wafer W by the blowing of the dry gas N, the resist solution R can be brought into contact with the solvent Q more securely and uniformly. The timing of the start of supply of the dry gas N from the dry gas nozzle 161 may be arbitrarily determined if it is before contact of the resist solution R with the solvent Q. However, the timing is preferably after the start of supply of the solvent Q from the solvent supply nozzle 158 and before the start of supply of the resist solution R from the resist solution supply nozzle 154.

After rotating the wafer W at the second rotational speed for a predetermined time, the supply of the resist solution R from the resist solution supply nozzle 154 is stopped and, simultaneously with the stoppage of the supply of the resist solution R, the rotational speed of the wafer W is reduced to a third rotational speed which is lower than the second rotational speed and higher than the first rotational speed (time $t_5$ of FIG. 7). The third rotational speed is preferably about 100 rpm to 800 rpm, and in this embodiment is e.g. 100 rpm. The phrase "simultaneously with the stoppage of the supply of the resist solution R" includes a case where the reduction in the rotational speed of the wafer W toward the third rotational speed has already started when the supply of the resist solution R is stopped (at time $t_5$). The rotational speed of the wafer W is reduced from the second rotational speed to the third rotational speed at a negative acceleration of, for example, 30000 rpm/sec.

After rotating the wafer W at the third rotational speed for a predetermined time, e.g. about 0.5 seconds, the wafer W is accelerated to a fourth rotational speed which is higher than the third rotational speed and lower than the second rotational speed (time $t_6$ of FIG. 7). The fourth rotational speed is preferably about 1000 rpm to 2000 rpm, and in this embodiment is e.g. 1000 rpm. The wafer W is rotated at the fourth rotational speed for a predetermined time, e.g. about 55 seconds, thereby drying the resist film (step T4 of FIG. 6).

Thereafter, a solvent as a rinsing solution is ejected from a not-shown rinse nozzle toward the back surface of the wafer W, thereby cleaning the back surface of the wafer W (step T5 of FIG. 6), thereby completing the sequence of coating steps in the resist coating apparatus 32.

The wafer W after the formation of the resist film is transported to the upper antireflective film forming apparatus 33 of the first block G1, where an upper antireflective film is formed on the wafer W (step S3 of FIG. 6). Thereafter, the wafer W is transported to the thermal treatment apparatus 40 of the second block G2, where the wafer W is subjected to thermal treatment. Thereafter, the wafer W is transported to the peripheral exposure apparatus 42, where exposure of a peripheral area of the resist film is performed (step S4 of FIG. 6).

Next, the wafer W is transported by the wafer transport device 100 to the transfer device 52, and is then transported by the shuttle transport device 80 to the transfer device 62 of the fourth block G4. Thereafter, the wafer W is transported by the wafer transport device 110 of the interface station 13 to the exposure apparatus 12, where the resist film is exposed in a predetermined pattern (step S5 of FIG. 6).

Next, the wafer W is transported by the wafer transport device 70 to the thermal treatment apparatus 40, where the wafer W is subjected to post-exposure baking. By the treatment, the resist film is caused to undergo a deprotection reaction with an acid generated in the exposed region of the resist film. Thereafter, the wafer W is transported by the wafer transport device 70 to the developing apparatus 30, where the exposed resist film is developed (step S6 of FIG. 6).

After completion of the development, the wafer W is transported to the thermal treatment apparatus 40, where the wafer W is subjected to post-baking (step S7 of FIG. 6). Next, the temperature of the wafer W is regulated in the thermal treatment apparatus 40. Thereafter, the wafer W is transported to a cassette C on a predetermined cassette plate 21 via the wafer transport device 70 and the wafer transport device 23, thereby completing the sequence of photolithography steps.

According to the embodiment described above, an annular liquid film of the solvent Q for the resist solution R is formed in a peripheral area of the wafer W and, in addition, the resist solution R is supplied to the center of the wafer W while rotating the wafer W at the first rotational speed, and subsequently the wafer W is rotated at the second rotational speed to allow the resist solution R to spread on the wafer W. The supply of the solvent Q is continued until just before the resist solution R comes into contact with the solvent Q. This makes it possible to keep the liquid film of the solvent Q in a good annular shape until just before the resist solution R comes into contact with the solvent Q, thereby enabling uniform contact between the liquid film of the solvent Q and the resist solution R in the plane of the wafer W. Accordingly, non-uniform distribution of the solvent Q on the wafer W can be prevented even when the contact angle between the wafer W and the solvent Q is large, and the resist solution R can be spread uniformly over the surface of the wafer W. Therefore, an in-plane uniform resist film can be formed on the wafer W.

In the above-described embodiment the supply of the solvent Q is stopped during the acceleration of the wafer W from the first rotational speed to the second rotational speed. However, the timing of stopping the supply of the solvent Q varies with various factors such as the rotational speed of the wafer W, the timing of the start of supply of the resist solution R, the amount of the resist solution R supplied and the viscosity of the resist solution R, and thus is not limited to that in the above-described embodiment. If the wafer W is rotated at a high speed while supplying the solvent Q to a peripheral portion of the wafer W, i.e. to an eccentric position on the wafer, the solvent Q which has been forced out of the wafer W can hit the cup 142 and splash. It is therefore preferred to set the timing of supply of the resist solution R and the amount of the resist solution R supplied so that the supply of the solvent Q will be stopped preferably before the second rotational speed is reached, more preferably before the start of acceleration to the second rotational speed.

Figure 14:
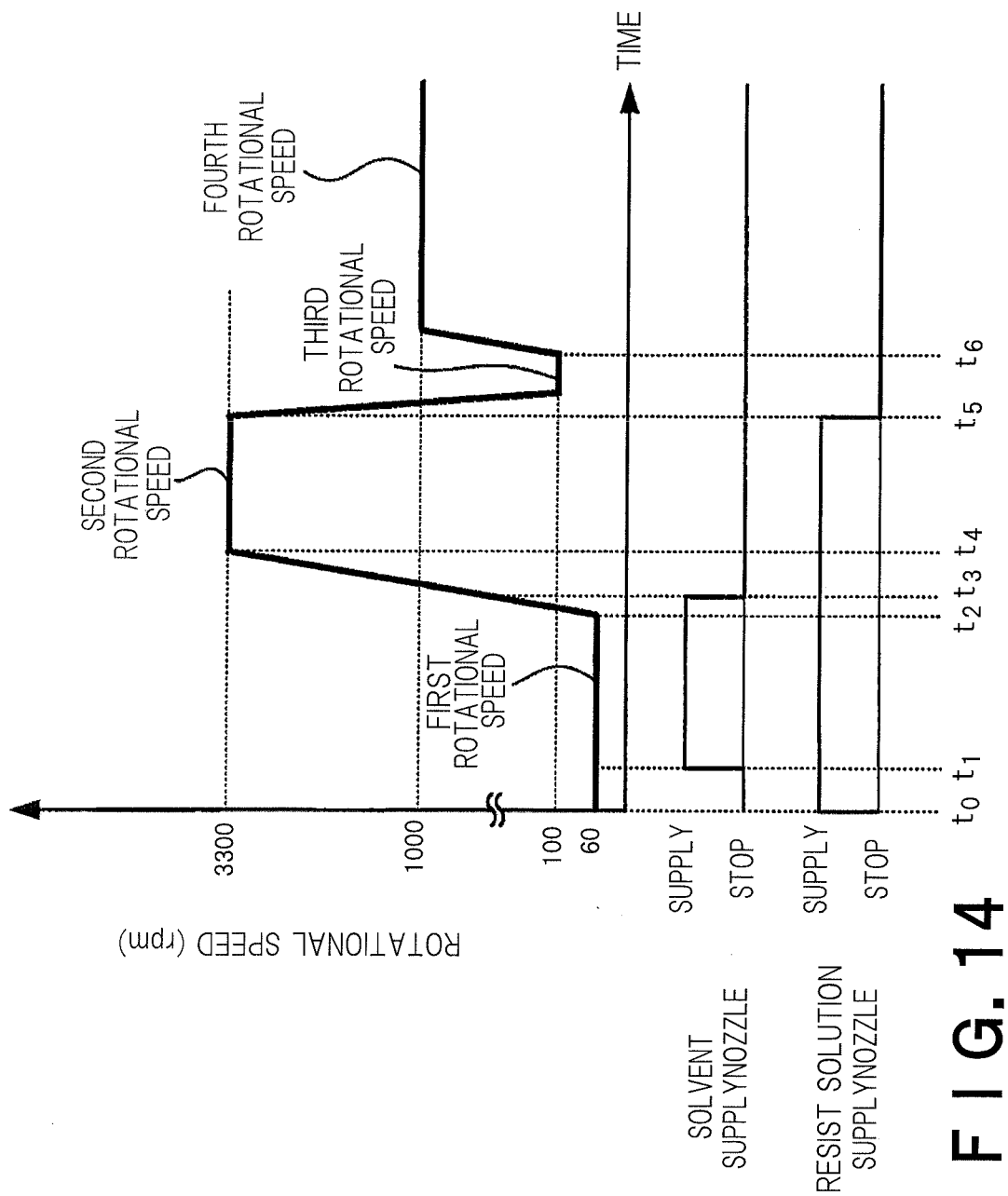
FIG. 14 is a time chart showing the rotational speed of a wafer and the operations of devices in a resist coating process according to another embodiment.

Though in the above-described embodiment the supply of the resist solution R is started after the start of supply of the solvent Q, the timing of supplying the resist solution R may be set arbitrarily. For example, as shown in FIG. 14, the supply of the resist solution R may be started before the start of supply of the solvent Q. In particular, while rotating the wafer W at the first rotational speed, the supply of the resist solution R is started at time $t_0$, and then the supply of the solvent Q is started at time $t_1$. Also in that case, by stopping the supply of the solvent Q before the resist solution R comes into contact with the liquid film of the solvent Q (time $t_3$ of FIG. 14), the liquid film of the solvent Q can be kept in an annular shape and the resist solution R can be spread uniformly over the surface of the wafer W.

Though in the above-described embodiment the same rotational speed of the wafer W is maintained during the supply of the solvent Q onto the wafer W, the rotational speed of the wafer W may be increased or decreased during the supply of the solvent Q. For example, while rotating the wafer W at 60 rpm which is equal to the first rotational speed, the supply of the solvent Q to a peripheral portion of the wafer W is started in the same manner as illustrate in FIG. 8. Thereafter, the rotational speed of the wafer W is increased e.g. to 3300 rpm which is equal to the second rotational speed, thereby allowing the solvent Q to spread to the periphery of the wafer W. The peripheral area of the wafer W is thus pre-wetted with the solvent Q (pre-wetting step). Thereafter, the rotational speed of the wafer W is decreased e.g. to the first rotational speed to start the above-described process from step T1. Such pre-wetting step enhances coatability of the solvent Q, especially in the peripheral area of the wafer W, in step T1, enabling the resist solution R to spread more uniformly on the wafer W in the later step T3. As described above, the time $t_2$ to start acceleration of the wafer W and the time $t_3$ to stop the supply of the solvent Q vary with various resist coating conditions, and therefore, in some cases, the rotational speed of the wafer W is increased during the supply of the solvent Q. However, such a case is not included in the above-described phrase "the rotational speed of the wafer W may be increased or decreased during the supply of the solvent Q". In other words, the phrase "the rotational speed of the wafer W may be increased or decreased during the supply of the solvent Q" refers solely to a possible operation to be performed prior to step T1. In order to reduce the amount of the solvent Q which is forced out of the periphery of the wafer W, the supply of the solvent Q may be stopped during the period when the wafer W is rotated at the second rotational speed to allow the solvent Q to spread on the wafer W.

In the above-described embodiment, when forming an annular liquid film of the solvent Q on the wafer W, the solvent Q is supplied to a peripheral portion of the wafer W while rotating the wafer W e.g. at the first rotational speed. However, a method to form an annular liquid film of the solvent Q is not limited to such method. Thus, in an exemplary method, as shown in FIG. 15, solvent supply nozzles 158 are supported by a support arm 211 as a support section that can rotate each solvent supply nozzle 158 about a vertical axis, passing through the center O of a wafer W, as the axis of rotation by means of a rotary drive mechanism 210 and, while keeping the wafer W stationary, the solvent supply nozzles 158 are moved along a peripheral portion of the wafer W. When the solvent Q is supplied while keeping the wafer W stationary, no centrifugal force acts on the solvent Q. The liquid film of the solvent Q can therefore be kept in a good annular shape. This method, which involves forming an annular liquid film of the solvent Q while keeping a wafer W stationary, is effective especially for a large diameter wafer W, such as a 450 mm wafer, which rotates with a high peripheral speed.

Though the two solvent supply nozzles 158 mounted to the support arm 211 are depicted in FIG. 15, it is possible to use three or more solvent supply nozzles 158. The use of a plurality of solvent supply nozzles 158 can make the angle of rotation of the support arm 211 small when forming an annular liquid film of the solvent Q, thereby increasing the throughput of processing of the wafer W. Thus, in the case where two solvent supply nozzles 158 are provided in opposite positions, the solvent Q can be supplied to the entire peripheral area of a wafer W by rotating the support arm 211 through 180 degrees. In the case where n (n is an integer greater than or equal to 3) solvent supply nozzles 158 are provided, it is only necessary to rotate the support arm 211 through 360/n degrees.

When the solvent supply nozzles 158 are rotated by the support arm 211, the wafer W may be rotated in the opposite direction from the direction of rotation of the support arm 211. This increases the rotational speed of the solvent supply nozzles 158 relative to the wafer W; therefore, a liquid film of the solvent Q can be formed more quickly.

A position on a wafer W to which the solvent Q is supplied upon the formation of an annular liquid film of the solvent Q is not limited to a peripheral portion of the wafer W. For example, it is possible to first supply the solvent Q to the center of a wafer W as shown in FIG. 16, and then blow dry $N_2$ gas from the dry gas nozzle 161 onto the solvent Q, thereby blowing away the solvent Q and forming an annular liquid film as shown in FIG. 17.

Figure 18:
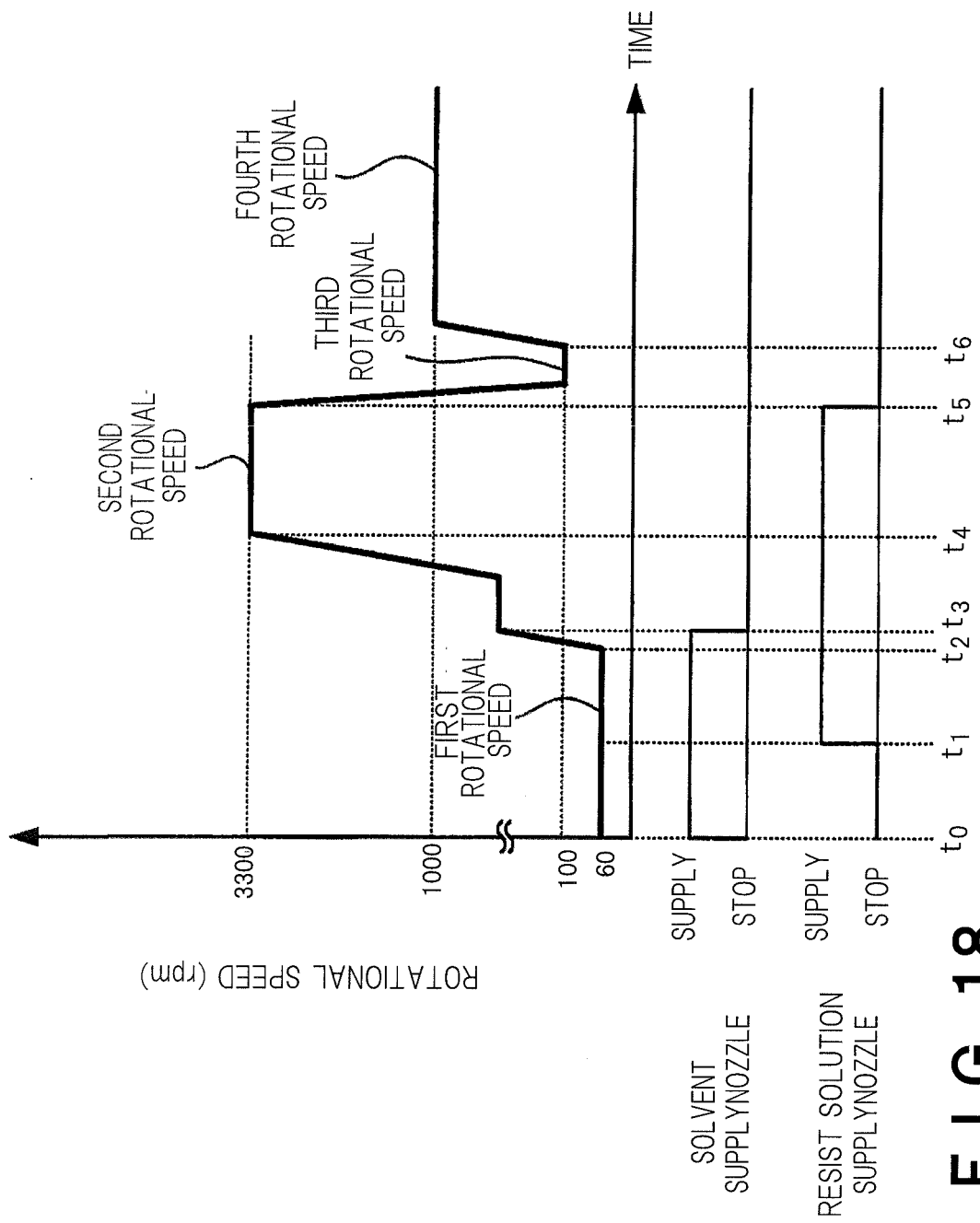
FIG. 18 is a time chart showing the rotational speed of a wafer and the operations of devices in a resist coating process according to yet another embodiment.

Though in the above-described embodiment the acceleration of the wafer W is kept constant during the period (e.g. $t_2$-$t_4$) when the wafer W is accelerated from the first rotational speed to the second rotational speed, the acceleration is not necessarily kept constant. For example, as shown in FIG. 18, it is possible to once maintain the rotational speed of the wafer W at about 600 rpm for a time, and then increase the rotational speed to the second rotational speed.

Example

In Example, a coating test was conducted by using a mid UV (MUV) resist having a viscosity of 190 cP as the resist solution R and cyclohexane as the solvent Q, and applying the resist solution onto a wafer W by the coating method according to the above-described embodiment. The amount of the resist solution R supplied was varied at 1-mL intervals in the range of 3 mL to 8 mL.

Figure 19:
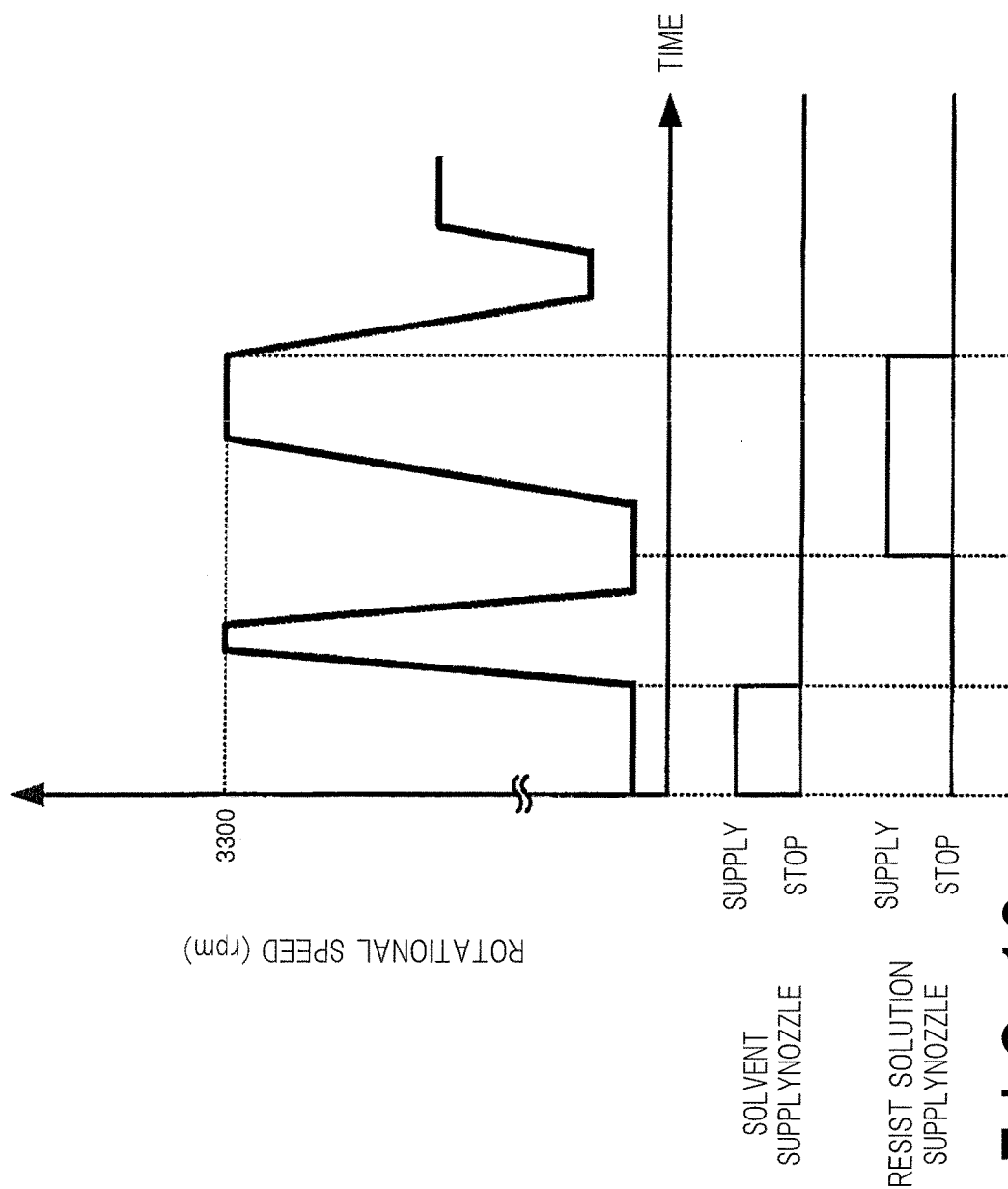
FIG. 19 is a time chart showing the rotational speed of a wafer and the operations of devices in the resist coating process of Comp. Example.

In Comparative Example, a coating test was conducted in the following manner. After supplying the solvent Q to a peripheral portion of a wafer W, the wafer W was rotated at a high speed, e.g. at the second rotational speed, to form an annular liquid film of the solvent Q. The supply of the solvent Q was then stopped and the rotational speed of the wafer W was decreased to the first rotational speed, and subsequently the resist solution R was supplied to the center of the wafer W. The rotational speed of the wafer W, the timing of supply of the resist solution R, the timing of supply of the solvent Q, etc. are shown in FIG. 19. The resist solution R and the solvent Q used in Comp. Example are the same as those of Example.

As a result of the tests, the resist film obtained in Comp. Example had a desired uniformity of the thickness in the plane of the wafer W when the amount of the resist solution R supplied was in the range of 4 mL to 8 mL. However, uneven coating of the resist film, which is considered to be due to worsening of the shape of the liquid film of the solvent Q, was observed in a peripheral area of the wafer W.

On the other hand, it was found that in the test of Example conducted by using the coating method according to the above-described embodiment, the resist film obtained has a good uniformity of the thickness in the plane of the wafer W at any of the varying amounts 4 mL to 8 mL of the resist solution R supplied. Further, unlike the comparative resist film, no uneven coating of the resist film was observed in a peripheral area of the wafer W. The test results thus verify that an in-plane coating film can be formed on a wafer W by the coating method according to the above-described embodiment.

While preferred embodiments of the present invention have been described with reference to the appended drawings, the present invention is not limited to the embodiments. Various changes and modifications to the preferred embodiments within the technical concept defined by the appended claims will be readily apparent to those of ordinary skill in the art, and it is understood that such changes and modifications naturally fall within the scope of the technical concept of the present invention. The present invention is not limited to the embodiments described above, but is capable of various embodiments. The present invention is applicable also to substrates other than a wafer, such as an FPD (Flat Panel Display) and a photomask or reticle.

INDUSTRIAL APPLICABILITY

The present invention is useful in applying a coating solution onto a substrate.

DESCRIPTION OF THE REFERENCE NUMERALS 1 substrate processing system
30 developing apparatus
31 lower antireflective film forming apparatus
32 resist coating apparatus
33 upper antireflective film forming apparatus
40 thermal treatment apparatus
41 adhesion apparatus
42 peripheral exposure apparatus
140 spin chuck
154 resist solution supply nozzle
158 solvent supply nozzle
161 dry gas nozzle
200 controller
Q solvent
R resist solution
W wafer

What is claimed is:
1. A coating method for applying a coating solution onto a substrate, comprising the steps of:
holding a substrate by a substrate holder for holding and rotating the substrate;
a solvent liquid film forming step of supplying a solvent for the coating solution from a solvent supply nozzle onto the substrate to form an annular liquid film of the solvent in a peripheral area of the substrate;
a coating solution supply step of supplying the coating solution from a coating solution supply nozzle to the center of the substrate while rotating the substrate at a first rotational speed; and
a coating solution spreading step of allowing the coating solution to spread on the substrate by rotating the substrate at a second rotational speed which is higher than the first rotational speed, wherein the supply of the solvent from the solvent supply nozzle is continued until just before the coating solution comes into contact with the liquid film of the solvent in the solvent liquid film forming step or the coating solution spreading step,
wherein in the solvent liquid film forming step, the annular liquid film of the solvent is formed by supplying the solvent from the solvent supply nozzle, positioned above a peripheral portion of the substrate, while rotating the substrate at a rotational speed of more than 0 rpm and not more than the first rotational speed, and
wherein before the start of the coating solution spreading step, a gap is secured between the liquid film of the solvent and the coating solution by blowing a dry gas from a dry gas nozzle onto a position between the solvent supply nozzle and the center of the substrate in a plan view.

2. The coating method according to claim 1, wherein in the solvent liquid film forming step, the annular liquid film of the solvent is formed by supplying the solvent from the solvent supply nozzle, which is moving along a peripheral portion of the substrate, while keeping the substrate stationary or rotating the substrate at a rotational speed of more than 0 rpm and not more than the first rotational speed.

3. The coating method according to claim 2, wherein the solvent supply nozzle includes a plural number of nozzles.

4. The coating method according to claim 1, wherein in the solvent liquid film forming step, the solvent is supplied from the solvent supply nozzle to a position at a radial distance of about 30 mm to 100 mm from the center of the substrate.

5. The coating method according to claim 1, wherein the supply of the solvent is continued until the distance between the outer peripheral end of the coating solution and the inner peripheral end of the annular liquid film of the solvent becomes 5 mm to 60 mm.

6. The coating method according to claim 1, wherein in the solvent liquid film forming step, the annular liquid film of the solvent is formed by supplying the solvent to the center of the substrate to form a puddle of the solvent, subsequently rotating the substrate to allow the solvent to diffuse on the substrate, thereby forming a liquid film of the solvent on the entire surface of the substrate, and then blowing a dry gas onto the center of the substrate to remove the liquid film of the solvent from a central portion of the substrate.

7. The coating method according to claim 1, wherein prior to the solvent liquid film forming step, a pre-wetting step is performed by supplying the solvent from the solvent supply nozzle, positioned above a peripheral portion of the substrate, to the peripheral portion while rotating the substrate at a rotational speed of more than 0 rpm and not more than the first rotational speed, and then allowing the solvent to spread to the periphery of the substrate by increasing the rotational speed of the substrate from the first rotational speed.

8. The coating method according to claim 7, wherein in the pre-wetting step, the supply of the solvent from the solvent supply nozzle is stopped during the period when the solvent is allowed to spread to the periphery of the substrate.

9. A computer-readable storage medium storing a program that operates on a computer as a controller for controlling a coating apparatus so that it performs the coating method according to claim 1.

10. A coating apparatus for applying a coating solution onto a substrate, comprising:
- a substrate holder for holding and rotating the substrate;
- a coating solution supply nozzle for supplying the coating solution onto the substrate;
- a solvent supply nozzle for supplying a solvent for the coating solution onto the substrate;
- a dry gas nozzle for blowing a du gas onto the substrate;
- a first movement mechanism for moving the coating solution supply nozzle;
- a second movement mechanism for moving the solvent supply nozzle;
- a third movement mechanism for moving the dry gas nozzle; and
- a controller configured to control the substrate holder, the coating solution supply nozzle, the solvent supply nozzle, the dry gas nozzle, the first movement mechanism, the second movement mechanism and the third movement mechanism so that they perform a method comprising the steps of: holding a substrate by the substrate holder for holding and rotating the substrate; a solvent liquid film forming step of supplying the solvent for the coating solution from the solvent supply nozzle onto the substrate to form an annular liquid film of the solvent in a peripheral area of the substrate; a coating solution supply step of supplying the coating solution from the coating solution supply nozzle to the center of the substrate while rotating the substrate at a first rotational speed; and a coating solution spreading step of allowing the coating solution to spread on the substrate by rotating the substrate at a second rotational speed which is higher than the first rotational speed,
  wherein in the solvent liquid film forming step the annular liquid film of the solvent is formed by supplying the solvent from the solvent supply nozzle, positioned above a peripheral portion of the substrate, while rotating the substrate at a rotational speed of more than 0 rpm and not more than the first rotational speed, and
  wherein before the start of the coating solution spreading step, a gap is secured between the liquid film of the solvent and the coating solution by blowing the dry gas from the dry gas nozzle onto a position between the solvent supply nozzle and the center of the substrate in a plan view.

11. The coating apparatus according to claim 10, further comprising a support section to which the solvent supply nozzle is mounted and which is configured to be rotatable above the substrate on a vertical axis passing through the center of the substrate as the axis of rotation, and a rotary drive mechanism for rotating the support section, wherein the annular liquid film of the solvent is formed in a peripheral area of the substrate by supplying the solvent from the solvent supply nozzle while rotating the support section by means of the rotary drive mechanism.

* * * * *